(12) United States Patent
Wu et al.

(10) Patent No.: US 10,804,134 B2
(45) Date of Patent: Oct. 13, 2020

(54) VACUUM TRANSFER DEVICE AND A METHOD OF FORMING THE SAME

(71) Applicant: Prilit Optronics, Inc., Tainan (TW)

(72) Inventors: Biing-Seng Wu, Tainan (TW); Chun-Jen Weng, Tainan (TW); Chao-Wen Wu, Tainan (TW)

(73) Assignee: Prilit Optronics, Inc., Tainan (TW)

(*) Notice: Subject to any disclaimer, the term of this patent is extended or adjusted under 35 U.S.C. 154(b) by 0 days.

(21) Appl. No.: 16/272,995

(22) Filed: Feb. 11, 2019

(65) Prior Publication Data
US 2020/0258767 A1    Aug. 13, 2020

(51) Int. Cl.
*H01L 21/683* (2006.01)
*H01L 21/308* (2006.01)
*B25J 15/06* (2006.01)
*H01L 33/00* (2010.01)
*H01L 21/033* (2006.01)

(52) U.S. Cl.
CPC ...... *H01L 21/6838* (2013.01); *B25J 15/0616* (2013.01); *H01L 21/0337* (2013.01); *H01L 21/3086* (2013.01); *H01L 33/005* (2013.01)

(58) Field of Classification Search
CPC .... B23Q 3/088; B25B 11/005; H01L 21/6838
See application file for complete search history.

(56) References Cited

U.S. PATENT DOCUMENTS

| | | | |
|---|---|---|---|
| 6,257,564 B1* | 7/2001 | Avneri | B25B 11/005 269/21 |
| 2003/0062734 A1* | 4/2003 | Faris | B25B 11/005 294/188 |
| 2009/0311087 A1* | 12/2009 | Na | H01L 21/6838 414/737 |
| 2010/0289283 A1* | 11/2010 | Watanabe | H01L 21/67132 294/183 |
| 2013/0140838 A1* | 6/2013 | Wang | H01L 21/6838 294/188 |

* cited by examiner

*Primary Examiner* — Tyrone V Hall, Jr.
(74) *Attorney, Agent, or Firm* — Donald E. Stout; Stout, Uxa & Buyan, LLP

(57) ABSTRACT

A vacuum transfer device includes a semiconductor substrate, which has a first hole disposed in a top portion of the semiconductor substrate; a nozzle disposed in a bottom portion of the semiconductor substrate and protruding downward, the nozzle being aligned with the first hole; and a second hole disposed through the nozzle and in the semiconductor substrate to meet the first hole.

9 Claims, 16 Drawing Sheets

VACUUM TRANSFER DEVICE AND A METHOD OF FORMING THE SAME

BACKGROUND OF THE INVENTION

1. Field of the Invention

The present invention generally relates to a micro light-emitting diode (microLED), and more particularly to a method of forming a vacuum transfer device adaptable to transferring the microLED.

2. Description of Related Art

A micro light-emitting diode (microLED, mLED or μLED) display panel is one of flat display panels, and is composed of microscopic microLEDs each having a size of 1-10 micrometers. Compared to conventional liquid crystal display panels, the microLED display panels offer better contrast, response time and energy efficiency. Although both organic light-emitting diodes (OLEDs) and microLEDs possess good energy efficiency, the microLEDs, based on group III/V (e.g., GaN) LED technology, offer higher brightness, higher luminous efficacy and longer lifespan than the OLEDs.

During manufacturing a microLED display panel, individual microLEDs should be picked up and transferred to a display panel, for example, by vacuum suction force. Conventional vacuum transfer devices are usually manufactured by laser or electromagnetic technique, which requires substantial working time and high cost, and therefore cannot be adapted to large-size or high-resolution display panels.

A need has thus arisen to propose a novel vacuum transfer device to overcome deficiency of conventional transfer devices.

SUMMARY OF THE INVENTION

In view of the foregoing, it is an object of the embodiment of the present invention to provide a method of forming a vacuum transfer device adaptable to transferring a micro device such as a micro light-emitting diode (microLED) in an economic and simple manner by using semiconductor device fabrication technique.

According to one embodiment, a method of forming a vacuum transfer device mainly includes the following steps. A first mask layer is formed on a top surface of a semiconductor substrate, and is etched to result in a pattern of a first hole through the first mask layer. The semiconductor substrate is etched by using the first mask layer as an etch mask to make the first hole in a top portion of the semiconductor substrate. A second mask layer is formed on a bottom surface of the semiconductor substrate, and is etched to result in a pattern defining a nozzle aligned with the first hole. The semiconductor substrate is etched by using the second mask layer as an etch mask to make the nozzle in a bottom portion of the semiconductor substrate and protruding downward. A third mask layer is formed on the bottom surface of the semiconductor substrate. The second mask layer is etched to result in a pattern of a second hole through the second mask layer. The semiconductor substrate is etched by using the second mask layer and the third mask layer as an etch mask to make the second hole through the nozzle and in the semiconductor substrate to meet the first hole.

DETAILED DESCRIPTION OF THE INVENTION

FIG. 1A to FIG. 1K show cross-sectional views illustrating a method of forming a vacuum transfer device adaptable to transferring a micro device such as a micro light-emitting diode (microLED) according to one embodiment of the present invention. A plurality of vacuum transfer devices may be formed simultaneously to form a vacuum transfer array.

Figure 1A:
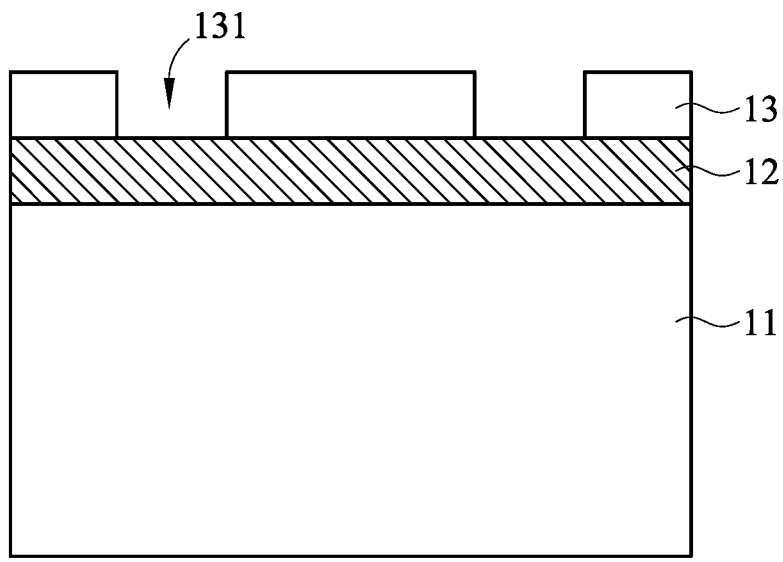
FIG. 1A to FIG. 1K show cross-sectional views illustrating a method of forming a vacuum transfer device adaptable to transferring a micro device according to one embodiment of the present invention.
Figure 1B:
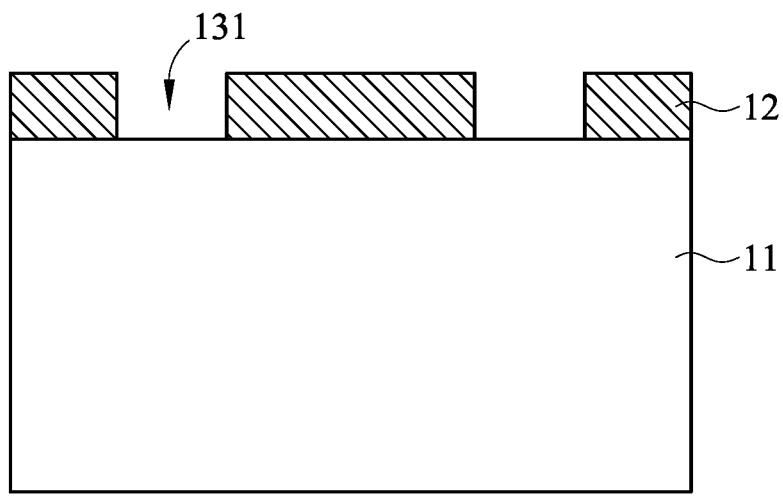

Referring to FIG. 1A, a semiconductor substrate 11 is provided. The semiconductor substrate 11 of the embodiment may, for example, be composed of silicon. A first mask layer 12 is formed on a top surface of the semiconductor substrate 11. The first mask layer 12 of the embodiment is a hardmask that acts as an etch mask in the following process steps. The first mask layer 12 of the embodiment may include, for example, silicon nitride $Si_3N_4$, silicon oxide $SiO_2$ or metal. A first photoresist (PR) layer 13 with a pattern defining a first hole (or holes) 131 is formed on the first mask layer 12. After the first photoresist layer 13 is subjected to photolithographic process (e.g., exposure and developing), the first mask layer 12 is etched by using the first photoresist layer 13 as an etch mask, thereby resulting in the first mask layer 12 with the pattern of the first hole 131 (vertically) through the first mask layer 12 as shown in FIG. 1B.

Figure 1C:
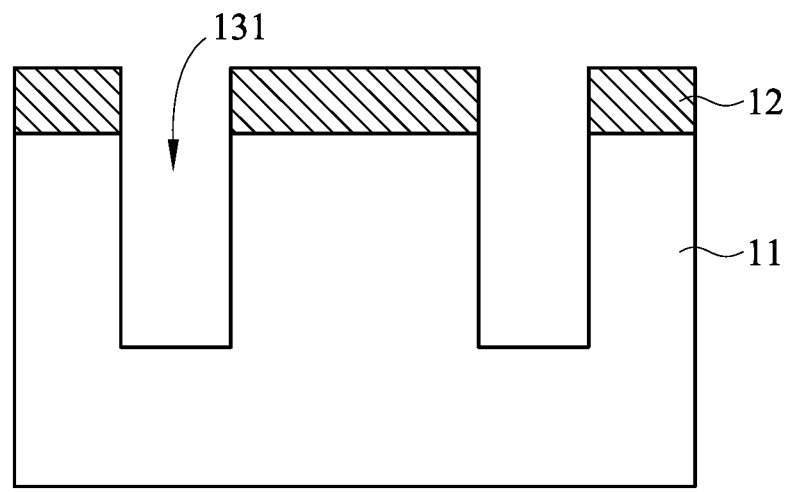

Referring to FIG. 1C, the semiconductor substrate 11 is etched (e.g., by dry etching) by using the first mask layer 12 as an etch mask to make the first hole 131 in a top portion of (but not through) the semiconductor substrate 11. The first mask layer 12 is then removed. In another embodiment, the first mask layer 12 remains on the semiconductor substrate 11 without being removed.

Figure 1D:
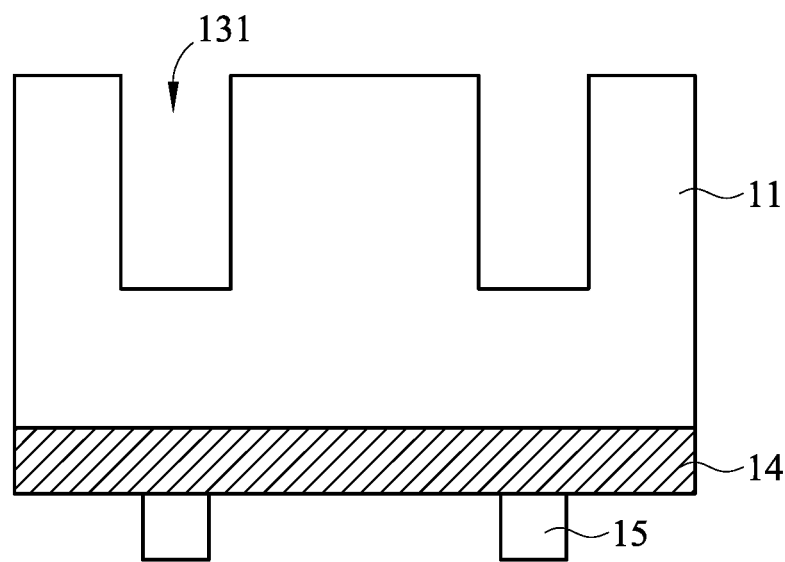
Figure 1E:
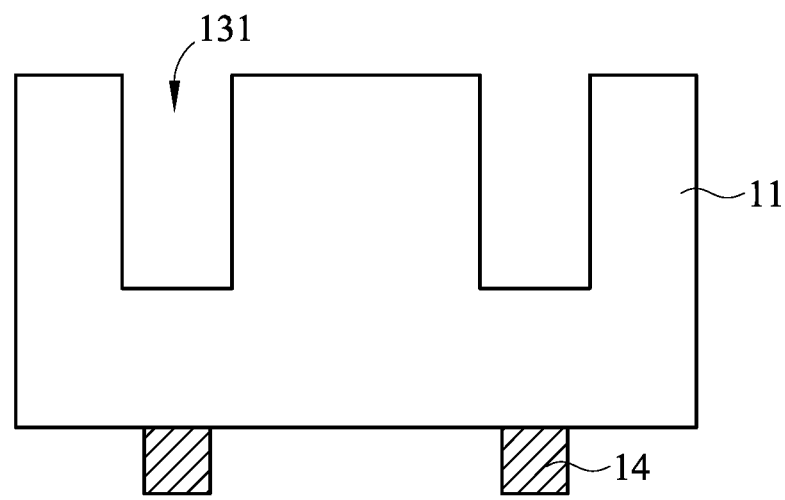

Referring to FIG. 1D, a second mask layer 14 is formed on a bottom surface of the semiconductor substrate 11. The second mask layer 14 of the embodiment is a hardmask that acts as an etch mask in the following process steps. The second mask layer 14 of the embodiment may include, for example, silicon nitride $Si_3N_4$, silicon oxide $SiO_2$ or metal. A second photoresist (PR) layer 15 with a pattern defining a nozzle (or nozzles) 151 aligned with the first hole 131 is formed on the second mask layer 14. After the second photoresist layer 15 is subjected to photolithographic process (e.g., exposure and developing), the second mask layer 14 is etched by using the second photoresist layer 15 as an etch mask, thereby resulting in the second mask layer 14 with the pattern of the nozzle 151 as shown in FIG. 1E.

Figure 1F:
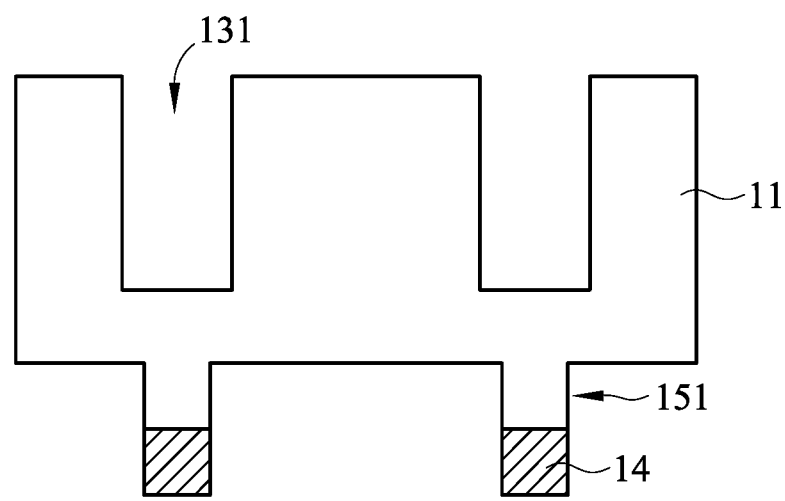

Referring to FIG. 1F, the semiconductor substrate 11 is etched (e.g., by dry etching) by using the second mask layer 14 as an etch mask to make the nozzle 151 in a bottom portion of the semiconductor substrate 11 and protruding downward. In the embodiment, the nozzle 151 may be aligned with, and at least partially overlapped with the first hole 131. The nozzle 151 may have a dimension (e.g., width) smaller than the first hole 131.

Figure 1G:
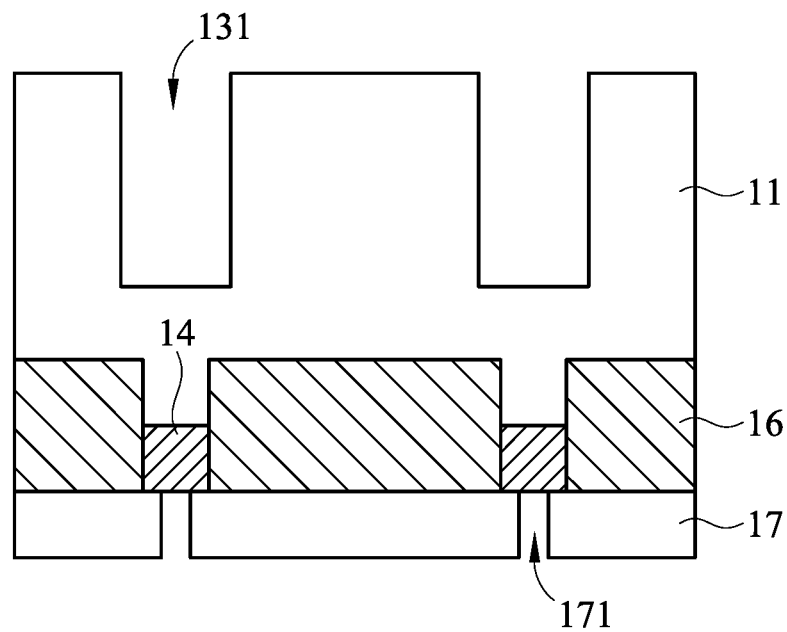
Figure 1H:
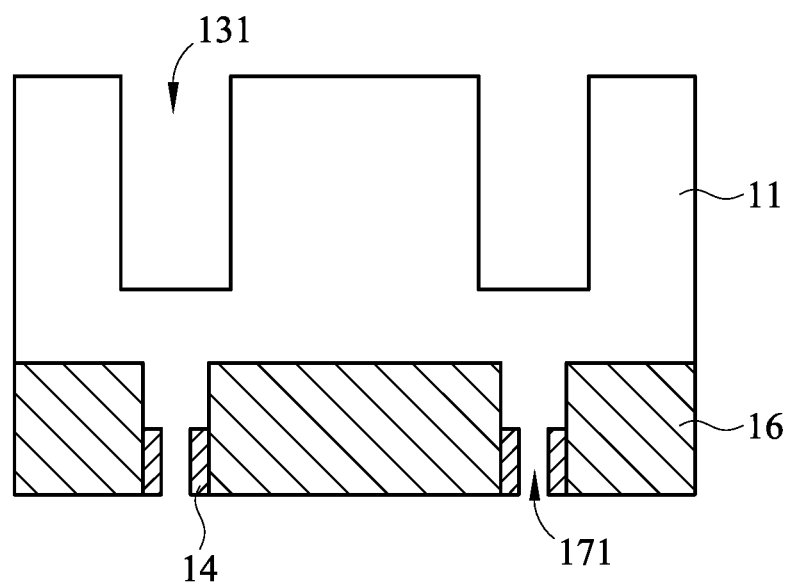

Referring to FIG. 1G, a third mask layer 16 is formed on a bottom surface of the semiconductor substrate 11. The third mask layer 16 of the embodiment is a hardmask that acts as an etch mask in the following process steps. The third mask layer 16 of the embodiment may include, for example, silicon nitride $Si_3N_4$, silicon oxide $SiO_2$ or metal. A third photoresist (PR) layer 17 with a pattern defining a second hole (or holes) 171 aligned with the nozzle 151 and the first hole 131 is formed on the second mask layer 14 and the third mask layer 16. After the third photoresist layer 17 is subjected to photolithographic process (e.g., exposure and developing), the second mask layer 14 and the third mask layer 16 are etched by using the third photoresist layer 17 as an etch mask, thereby resulting in the second mask layer 14 with the pattern of the second hole 171 (vertically) through the nozzle 151 as shown in FIG. 1H.

Figure 1I:
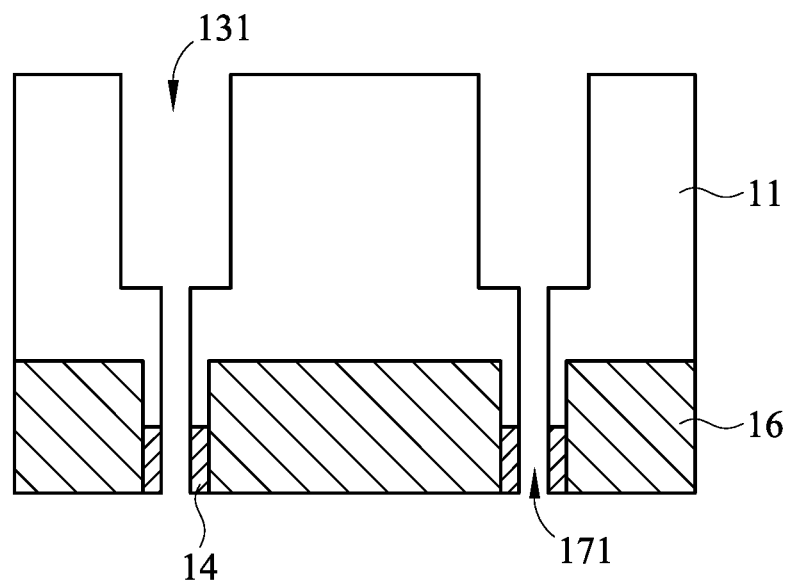

Referring to FIG. 1I, the semiconductor substrate 11 is etched by using the second mask layer 14 and the third mask layer 16 as an etch mask to make the second hole 171 in and (vertically) through the nozzle 151 and in the semiconductor substrate 11 to meet (i.e., communicate with) the first hole 131. In the embodiment, the second hole 171 may be aligned with, and at least partially overlapped with the nozzle 151 and the first hole 131. The second hole 171 may have a dimension (e.g., width) smaller than the nozzle 151. In one embodiment, the dimension (e.g., width) of the second hole 171 may be less than or equal to 100 micrometers.

Figure 1J:
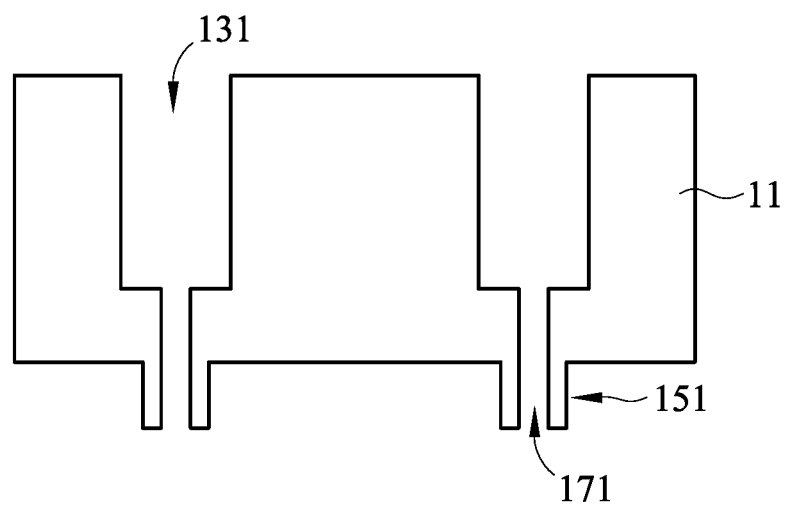

Referring to FIG. 1J, the second mask layer 14 and the third mask layer 16 are then removed. In another embodiment, the second mask layer 14 and the third mask layer 16 remain on the semiconductor substrate 11 without being removed.

Figure 1K:
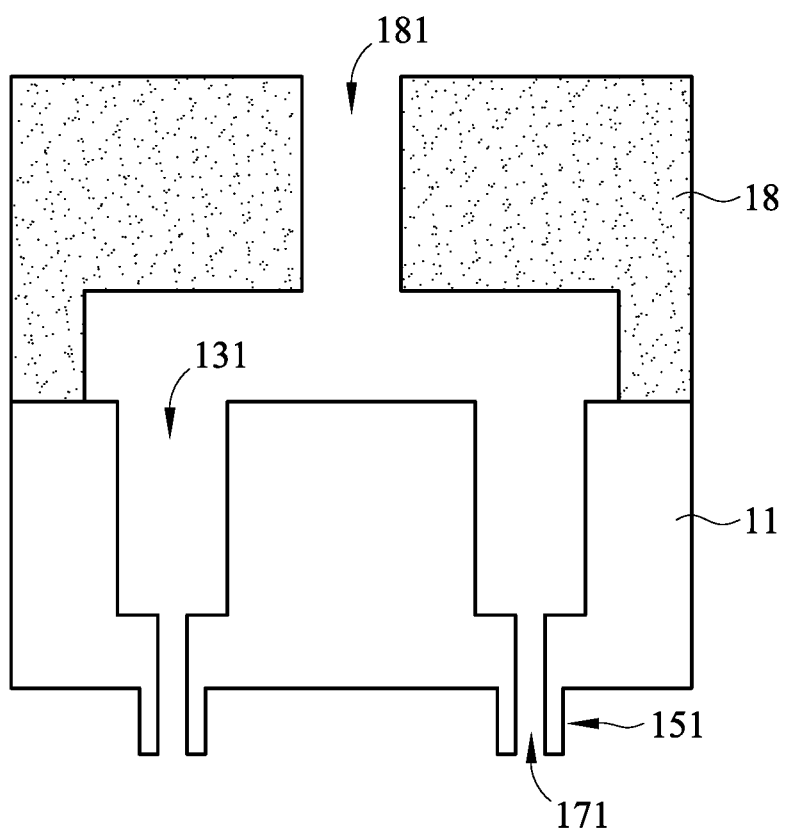

Referring to FIG. 1K, an adaptor 18 may hold (e.g., suck) the top surface of the semiconductor substrate 11 by vacuum force. The adaptor 18 may have a vacuum channel 181 (vertically) through the adaptor 18. The vacuum channel 181 may communicate with the first hole 131 and the second hole 171 (in the semiconductor substrate 11). In the specific embodiment shown in FIG. 1K, one vacuum channel 181 is associated with plural (e.g., two) first holes 131.

Figure 2A:
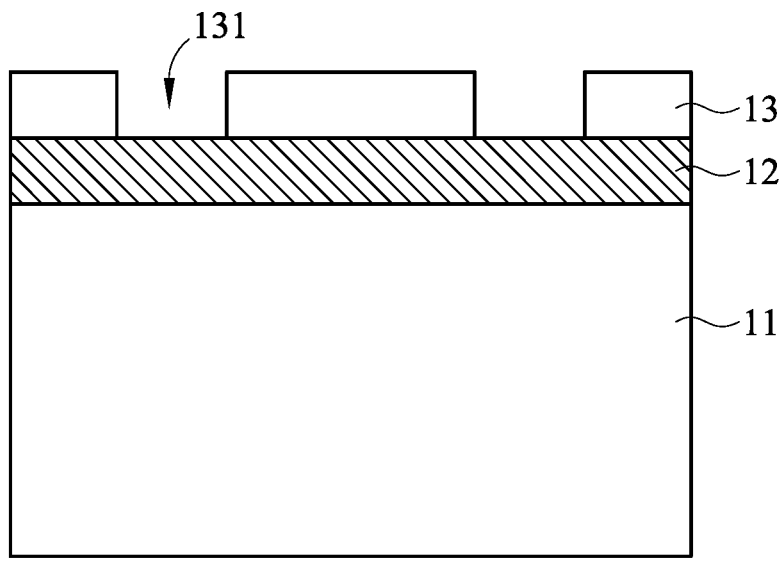
FIG. 2A to FIG. 2K show cross-sectional views illustrating a method of forming a vacuum transfer device adaptable to transferring a micro device according to another embodiment of the present invention.
Figure 2B:
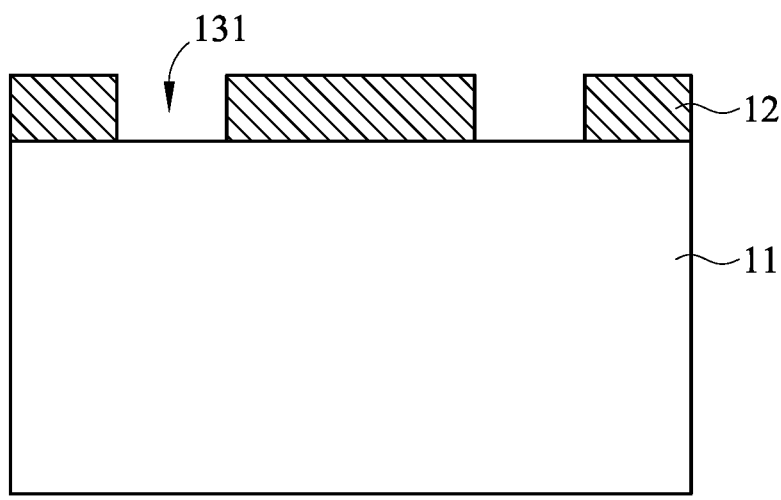
Figure 2C:
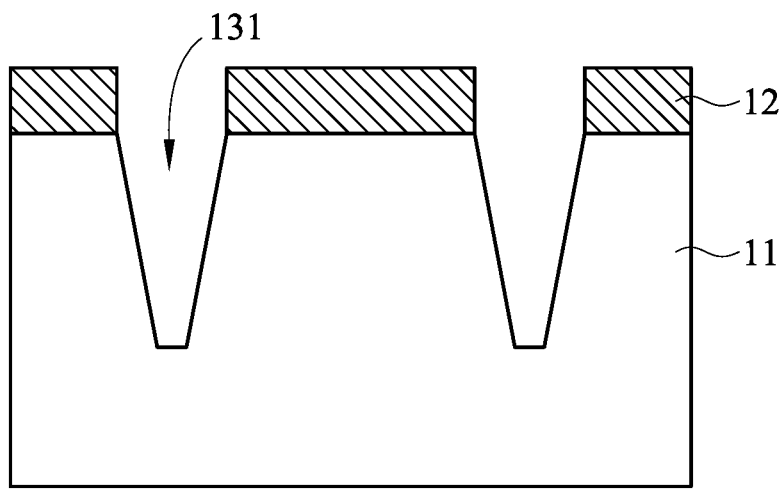
Figure 2D:
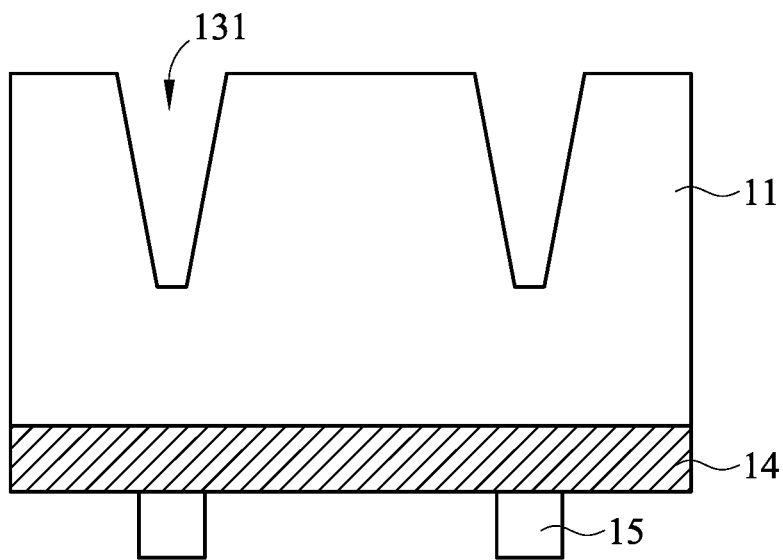
Figure 2E:
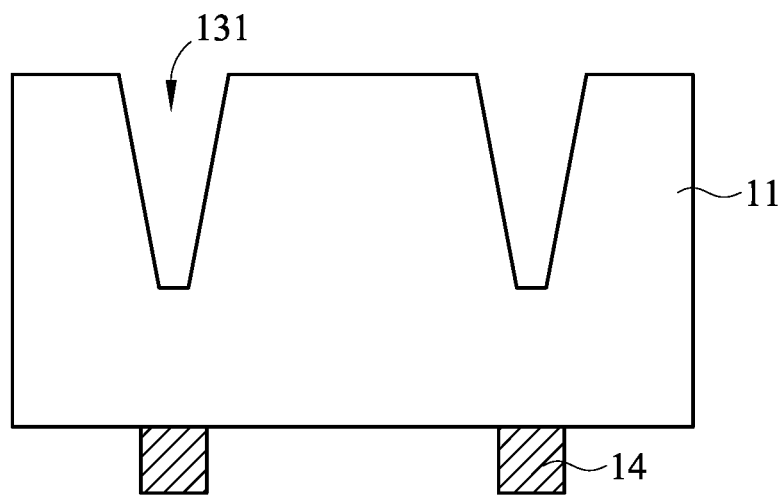
Figure 2F:
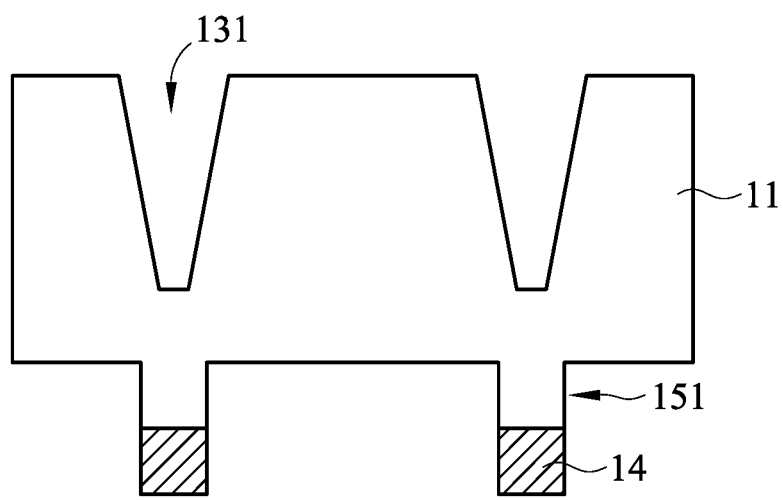
Figure 2G:
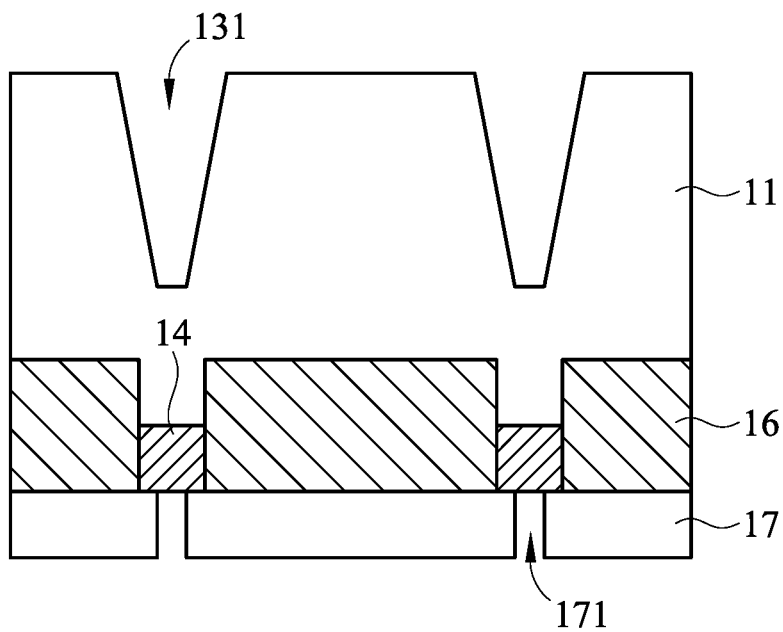
Figure 2H:
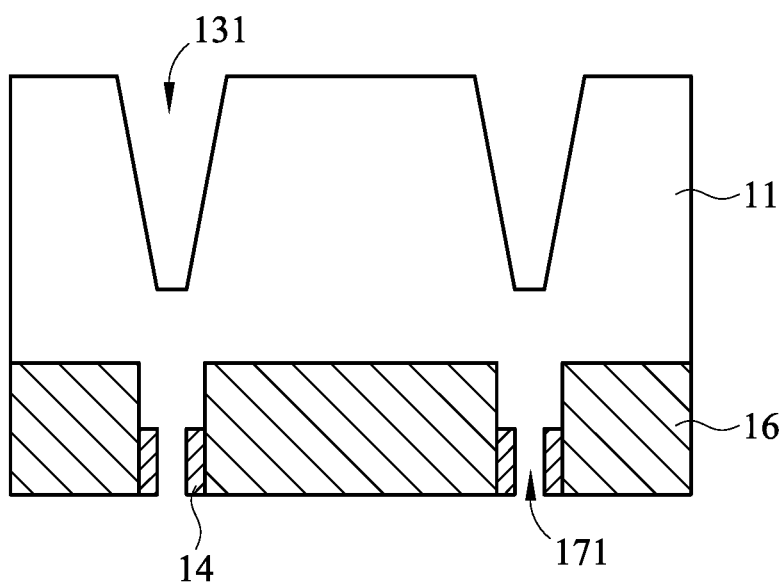
Figure 2I:
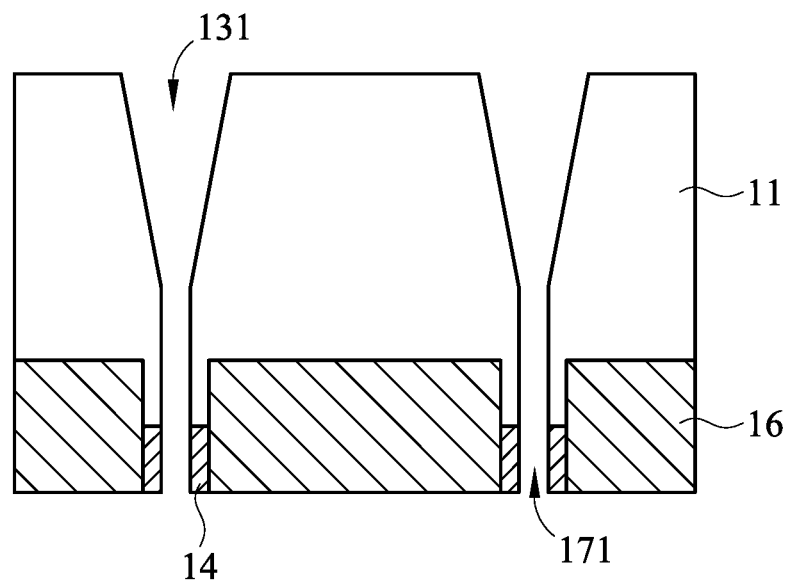
Figure 2J:
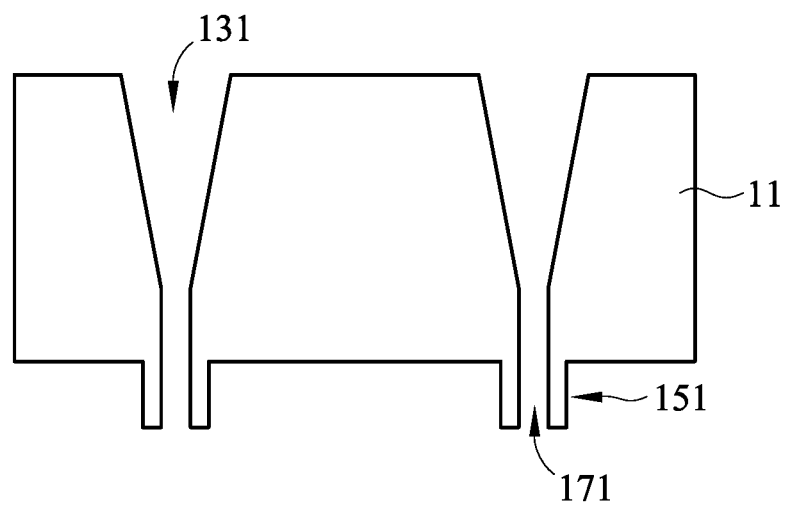
Figure 2K:
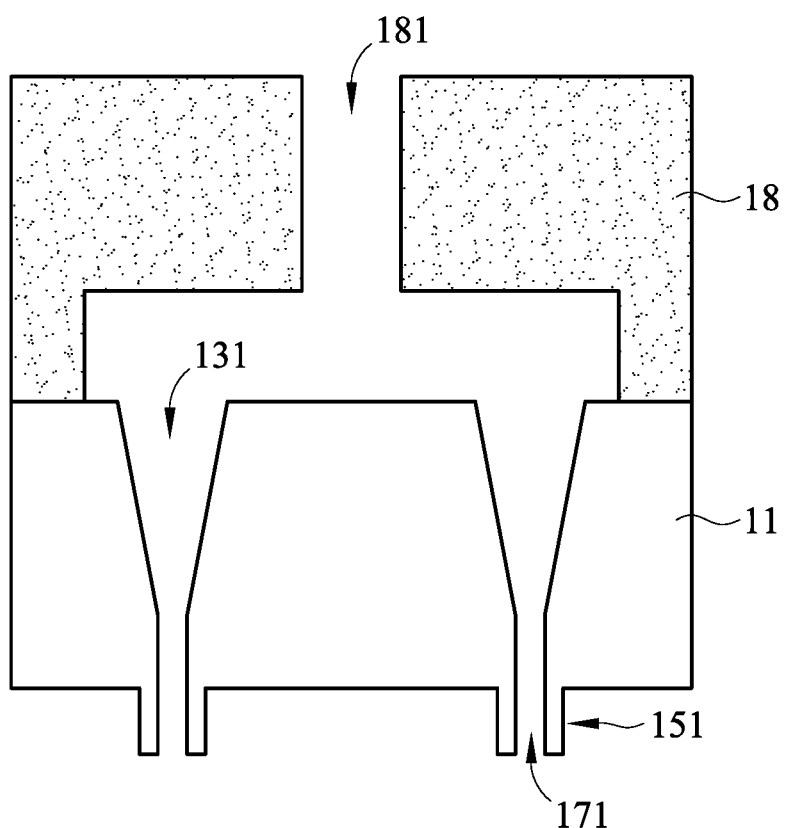

In the embodiment discussed above, the process associated with FIG. 1C is performed by dry etching only. FIG. 2A to FIG. 2K show cross-sectional views illustrating a method of forming a vacuum transfer device by wet and dry etching adaptable to transferring a micro device such as a micro light-emitting diode (microLED) according to another embodiment of the present invention. In this embodiment, the process associated with FIG. 2C is performed by wet etching.

Figure 3A:
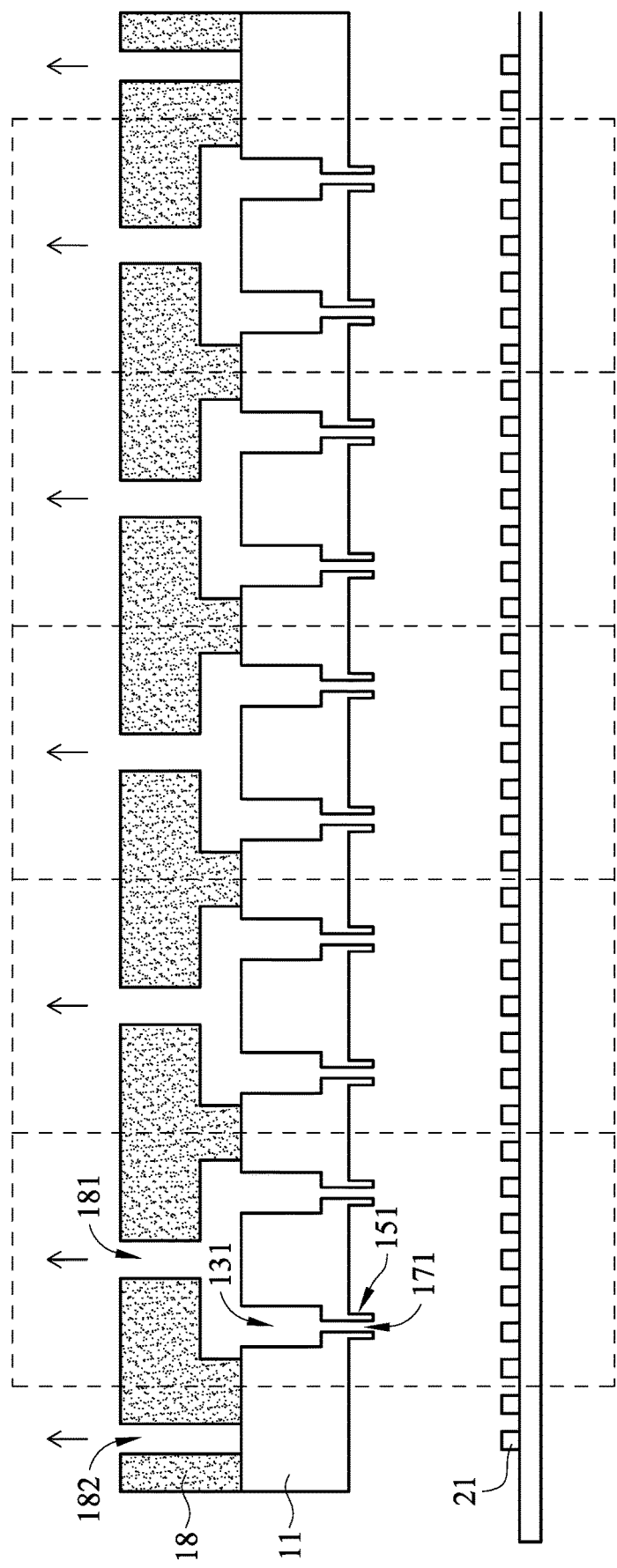
FIG. 3A shows a cross-sectional view illustrating an array of vacuum transfer devices performed by dry etching only.
Figure 3B:
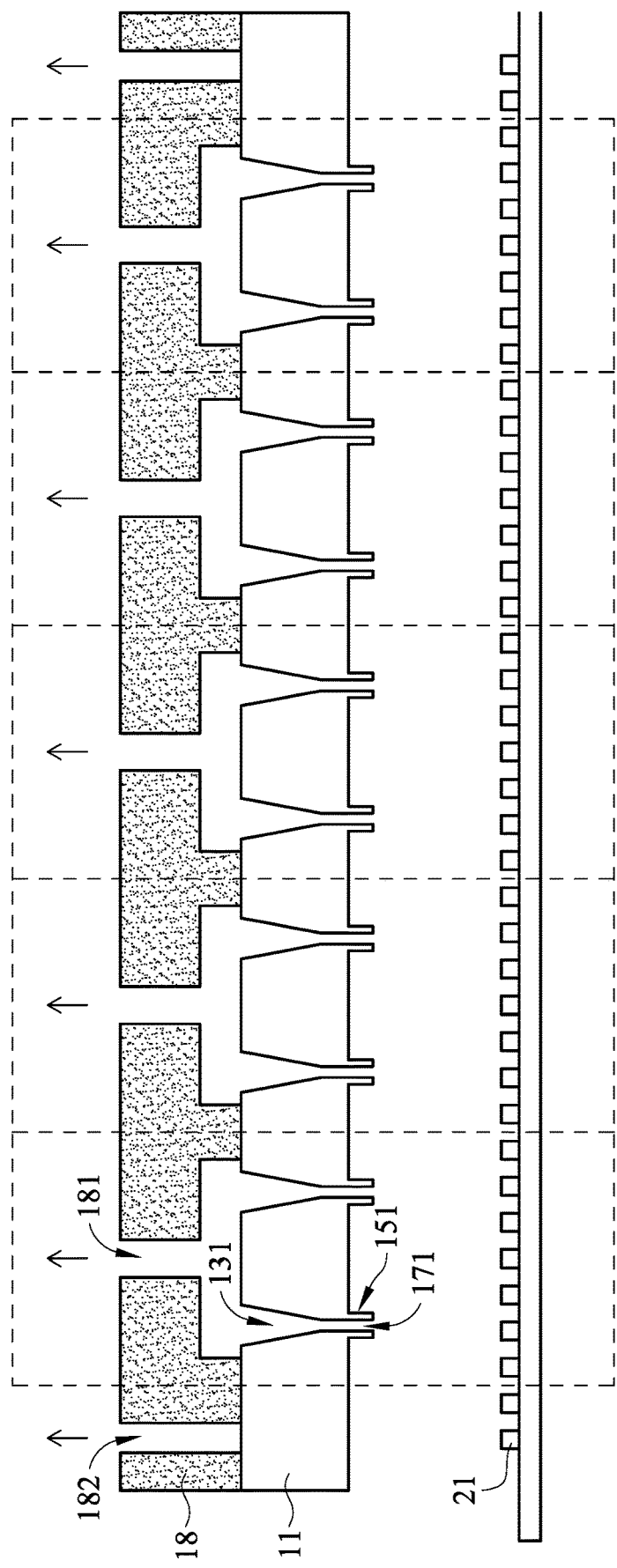
FIG. 3B shows a cross-sectional view illustrating an array of vacuum transfer devices performed by wet and dry etching.

FIG. 3A shows a cross-sectional view illustrating an array of vacuum transfer devices (i.e., a vacuum transfer array) performed by dry etching only, and FIG. 3B shows a cross-sectional view illustrating an array of vacuum transfer devices performed by wet and dry etching. When air is being pumped out through a top opening of the vacuum channel 181, vacuum is generated therein and microLEDs 21 (disposed on an LED substrate) may be sucked at a bottom opening of the second hole 171 (of the nozzle 151) and ready to be placed, for example, on a display substrate. The microLEDs 21 may be released when the air pumping stops.

In the embodiment, the adaptor 18 may have a plurality of peripheral channels 182 (vertically) through the adaptor 18 and located on a periphery of the adaptor 18. When air is being pumped out through a top opening of the peripheral channel 182, vacuum is generated therein and the semiconductor substrate 11 may be sucked at a bottom opening of the peripheral channel 182. The semiconductor substrate 11 may be released when the air pumping stops.

Figure 4A:
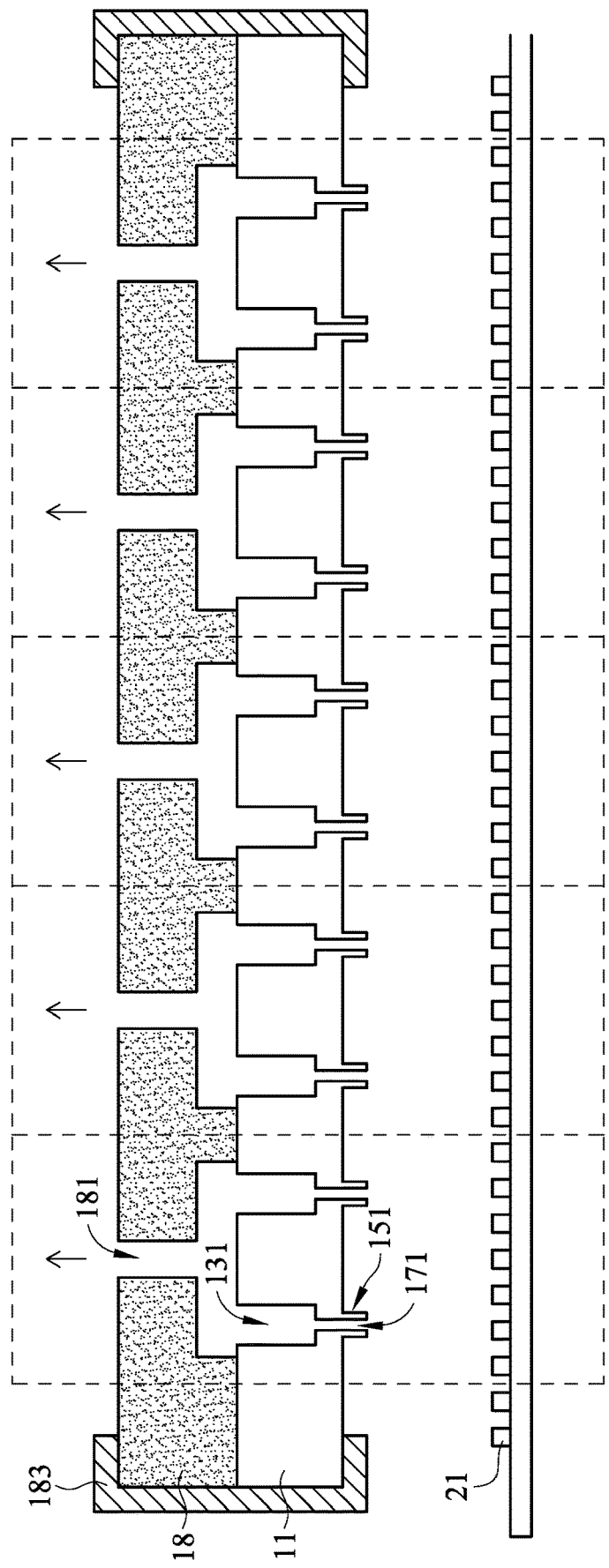
FIG. 4A shows a cross-sectional view illustrating an array of vacuum transfer devices performed by dry etching only.
Figure 4B:
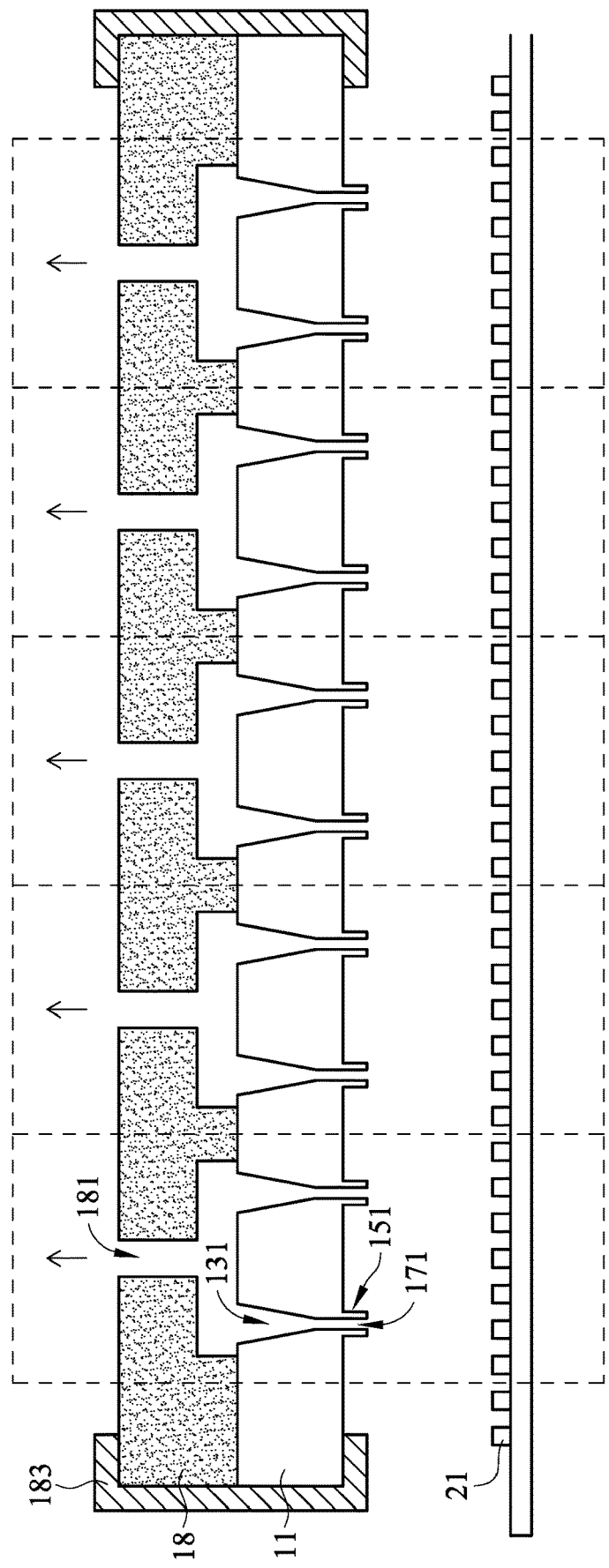
FIG. 4B shows a cross-sectional view illustrating an array of vacuum transfer devices performed by wet and dry etching.

In another embodiment, as shown in FIG. 4A which illustrates an array of vacuum transfer devices performed by dry etching only, or as shown in FIG. 4B which illustrates an array of vacuum transfer devices performed by dry and wet etching, a clamp 183 may be further provided to fasten the adaptor 18 and the semiconductor substrate 11 by mechanical mechanism.

According to the embodiment as set forth above, an economic and fast scheme has been proposed to make an array of vacuum transfer device adaptable to transferring a microLED. The proposed scheme may be well adaptable to large-size or high-resolution microLED display panel. Moreover, the proposed scheme is scalable and is capable of increasing or decreasing the size of the array of vacuum transfer device according to requirement.

Although specific embodiments have been illustrated and described, it will be appreciated by those skilled in the art that various modifications may be made without departing from the scope of the present invention, which is intended to be limited solely by the appended claims.

What is claimed is:

1. A vacuum transfer device, comprising:
   a semiconductor substrate having:
   a plurality of first holes disposed in a top portion of the semiconductor substrate;
   a plurality of nozzles disposed in a bottom portion of the semiconductor substrate and protruding downward, the nozzles being aligned with the first holes respectively;
   a plurality of second holes disposed through the nozzles respectively and in the semiconductor substrate to meet the corresponding first holes;
   a second mask layer disposed on a bottom surface of the nozzles but not covering the second holes; and
   a third mask layer disposed on a bottom, surface of the semiconductor substrate but not covering the nozzles;
   wherein micro light-emitting diodes are individually sucked at a bottom opening of the second holes.

2. The device of claim 1, wherein the nozzle is at least partially overlapped with the first hole.

3. The device of claim 1, wherein the nozzle has a dimension smaller than the first hole.

4. The device of claim 1, wherein the second hole is at least partially overlapped with the nozzle and the first hole.

5. The device of claim 1, wherein the second hole has a dimension smaller than the nozzle.

6. The device of claim 1, further comprising:
   a first mask layer disposed on a top surface of the semiconductor substrate but not covering the first holes.

7. The device of claim 6, wherein the first mask layer, the second mask layer or the third mask layer comprises silicon nitride, silicon oxide or metal.

8. The device of claim 1, further comprising:
   an adaptor that holds a top surface of the semiconductor substrate;

wherein the adaptor has a vacuum channel through the adaptor and communicating with the first hole.

9. The device of claim 8, wherein the adaptor has a plurality of peripheral channels through the adaptor and located on a periphery of the adaptor.

\* \* \* \* \*